(12) United States Patent
Yang et al.

(10) Patent No.: US 9,911,773 B2
(45) Date of Patent: Mar. 6, 2018

(54) VIRTUAL HIGH DYNAMIC RANGE LARGE-SMALL PIXEL IMAGE SENSOR

(71) Applicant: OMNIVISION TECHNOLOGIES, INC., Santa Clara, CA (US)

(72) Inventors: Dajiang Yang, San Jose, CA (US); Gang Chen, San Jose, CA (US); Oray Orkun Cellek, Mountain View, CA (US); Zhenhong Fu, San Jose, CA (US); Chen-Wei Lu, San Jose, CA (US); Duli Mao, Sunnyvale, CA (US); Dyson H. Tai, San Jose, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 55 days.

(21) Appl. No.: 14/743,385

(22) Filed: Jun. 18, 2015

(65) Prior Publication Data
US 2016/0372507 A1   Dec. 22, 2016

(51) Int. Cl.
*H01L 27/146* (2006.01)
*H04N 5/374* (2011.01)
*H04N 5/355* (2011.01)

(52) U.S. Cl.
CPC .... *H01L 27/14621* (2013.01); *H01L 27/1463* (2013.01); *H01L 27/1464* (2013.01);
(Continued)

(58) Field of Classification Search
CPC ......... H01L 27/14621; H01L 27/14627; H01L 27/14685; H01L 2924/00; H01L 27/1463;
(Continued)

(56) References Cited

U.S. PATENT DOCUMENTS 3,971,065 A   7/1976   Bayer
8,530,266 B1   9/2013   Chen et al.
(Continued)

FOREIGN PATENT DOCUMENTS

TW   392351 B   6/2000
TW   404141 B   9/2000
(Continued)

OTHER PUBLICATIONS

"Bayer filter," Wikipedia, the free encyclopedia, pp. 1-6, retrieved Jun. 18, 2015 from: https://en.wikipedia.org/wiki/Bayer_filter.
(Continued)

*Primary Examiner* — Fernando L Toledo
*Assistant Examiner* — Lawrence-Linh T Nguyen
(74) *Attorney, Agent, or Firm* — Christensen O'Connor Johnson Kindness PLLC

(57) ABSTRACT

An image sensor includes photodiodes arranged in semiconductor material. Each of the photodiodes is identically sized and is fabricated in the semiconductor material with identical semiconductor processing conditions. The photodiodes are organized into virtual large-small groupings including a first photodiode and a second photodiode. Microlenses are disposed over the semiconductor material with each of microlenses disposed over a respective photodiode. A first microlens is disposed over the first photodiode, and a second microlens is disposed over the second photodiode. A mask is disposed between the first microlens and the first photodiode. The mask includes an opening through which a first portion of incident light directed through the first microlens is directed to the first photodiode. A second portion of the incident light directed through the first microlens is blocked by the mask from reaching the first photodiode. There is no mask between the second microlens and the second photodiode.

17 Claims, 4 Drawing Sheets

(52) U.S. Cl.
CPC .. *H01L 27/14603* (2013.01); *H01L 27/14623* (2013.01); *H01L 27/14627* (2013.01); *H01L 27/14645* (2013.01); *H04N 5/35563* (2013.01); *H04N 5/374* (2013.01)

(58) Field of Classification Search
CPC ... H01L 27/762; H01L 31/00; H01L 31/0232; H01L 31/0216; H01L 27/146
See application file for complete search history.

(56) References Cited

U.S. PATENT DOCUMENTS

| | | | |
|---|---|---|---|
| 2005/0103983 A1 | 5/2005 | Yamaguchi et al. | |
| 2010/0038523 A1* | 2/2010 | Venezia | H01L 27/14627 250/216 |
| 2010/0108866 A1 | 5/2010 | Tseng et al. | |
| 2010/0238330 A1* | 9/2010 | Hirota | H01L 27/14621 348/273 |
| 2010/0314667 A1* | 12/2010 | Nozaki | H01L 27/14609 257/225 |
| 2011/0141333 A1 | 6/2011 | Naruse et al. | |
| 2013/0134414 A1* | 5/2013 | Yamazaki | H01L 29/7869 257/43 |
| 2014/0078366 A1 | 3/2014 | Dokoutchaev et al. | |
| 2014/0210028 A1 | 7/2014 | Chen et al. | |
| 2014/0246561 A1 | 9/2014 | Chen et al. | |
| 2014/0291481 A1 | 10/2014 | Zhang et al. | |
| 2015/0091119 A1 | 4/2015 | Chen et al. | |

FOREIGN PATENT DOCUMENTS

| | | |
|---|---|---|
| TW | 452988 B | 9/2001 |
| TW | 200905870 A | 2/2009 |
| TW | 201018969 A | 5/2010 |
| TW | 201405782 A | 2/2014 |
| TW | 201431054 A | 8/2014 |
| TW | 201436181 A | 9/2014 |

OTHER PUBLICATIONS

TW Patent Application No. 105116506—Taiwanese Search Report, dated Feb. 8, 2017, with English Translation (2 pages).

* cited by examiner

VIRTUAL HIGH DYNAMIC RANGE LARGE-SMALL PIXEL IMAGE SENSOR

BACKGROUND INFORMATION

Field of the Disclosure

The present invention relates generally to imaging, and more specifically, the present invention is directed to high dynamic range image sensors.

Background

Image sensors have become ubiquitous. They are widely used in digital still cameras, cellular phones, security cameras, as well as, medical, automobile, and other applications. The technology used to manufacture image sensors, such as for example complementary metal-oxide-semiconductor (CMOS) image sensors (CIS), has continued to advance at a great pace. For example, the demands for higher resolution and lower power consumption have encouraged the further miniaturization and integration of these image sensors.

High dynamic range (HDR) image sensors have become useful for many applications. In general, ordinary image sensors, including for example charge coupled device (CCD) and CMOS image sensors, have a dynamic range of approximately 70 dB dynamic range. In comparison, the human eye has a dynamic range of up to approximately 100 dB. There are a variety of situations in which an image sensor having an increased dynamic range is beneficial. For example, image sensors having a dynamic range of more than 100 dB dynamic range are needed in the automotive industry are necessary in order to handle different driving conditions, such as driving from a dark tunnel into bright sunlight. Indeed, many applications may require image sensors with at least 90 dB of dynamic range or more to accommodate a wide range of lighting situations, varying from low light conditions to bright light conditions.

One of the challenges with modern high dynamic range image sensors that use dual pixels having large and small photodiodes is the process complexity that is involved in order to provide the different semiconductor process conditions needed in order to fabricate the large photodiodes and the small photodiodes. In addition, there is asymmetric blooming, crosstalk, and noise associated with the large photodiodes and the small photodiodes, which result in unbalanced high dynamic range imaging. Furthermore, the small photodiodes have limited full well capacity compared to the large photodiodes, which limit the extension of the high light dynamic range.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
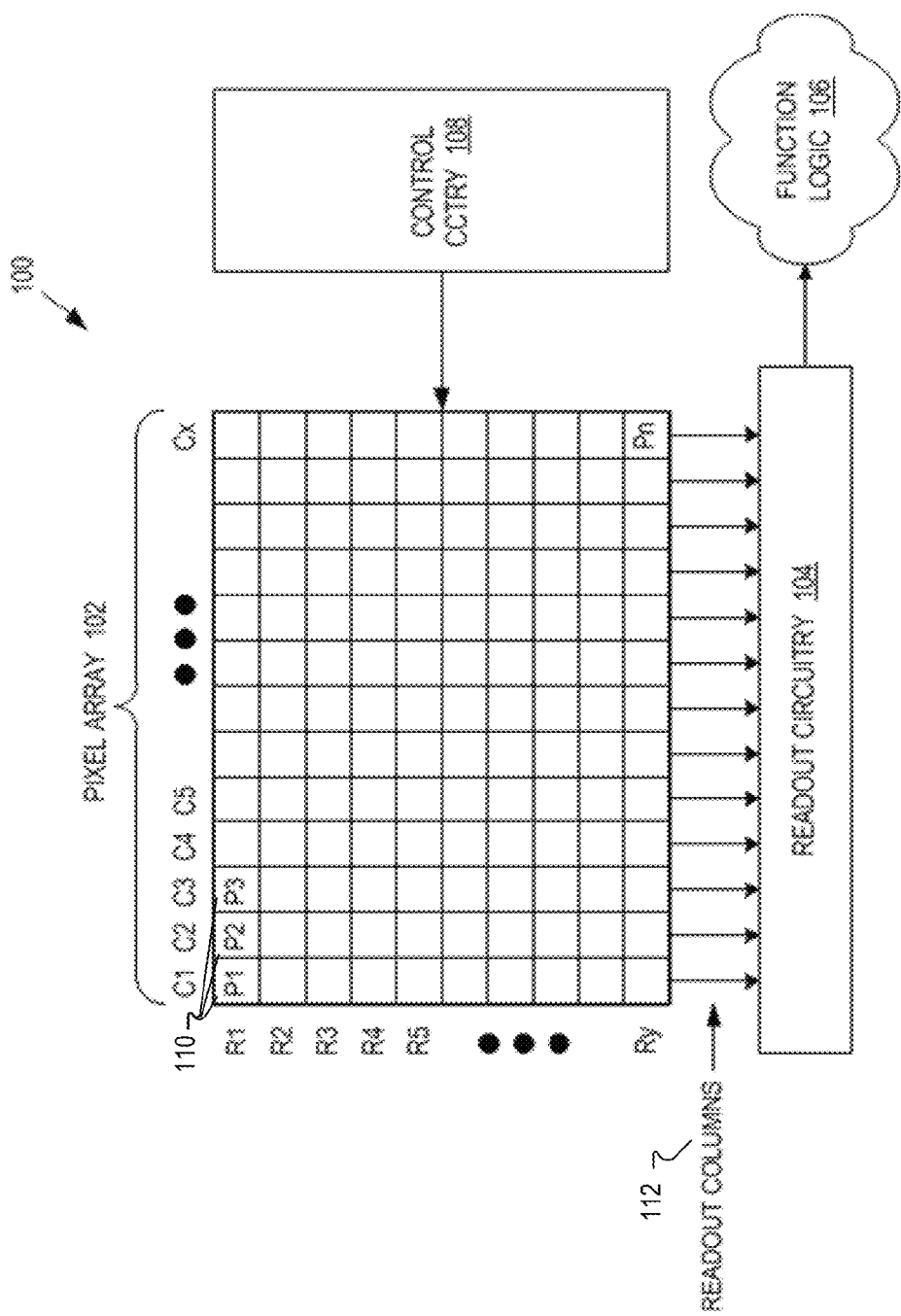
FIG. 1 is a diagram illustrating one example of an imaging system including an example virtual high dynamic range large-small pixel image sensor in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Examples in accordance with the teaching of the present invention describe a virtual high dynamic range (HDR) large-small pixel image sensor in which a plurality of photodiodes are arranged into virtual large-small pixel groupings (e.g., pairs) including virtual large and virtual small symmetrical pixels having photodiodes that are identically sized, and fabricated with identical semiconductor processing conditions. With the photodiodes of the large-small pixel groupings having the same size, processing is simplified since the same semiconductor fabrication process conditions can be used when fabricating the photodiodes. In addition, geometrical symmetry can be realized between the virtual large and small photodiodes, which can result in fewer fabrication process steps, and increased symmetry for electrical and optical performance, which therefore provides improved performance with respect to blooming, crosstalk, photoresponse nonuniformity (PRNU), and the like. Furthermore, the virtual small photodiode has a full well capacity substantially equal to the full well capacity of the virtual large photodiode, which provides improved high light dynamic range for the virtual small photodiode.

To illustrate, FIG. 1 is a diagram that shows generally one example of a virtual HDR large-small pixel image sensing system 100 including an image sensor having example pixel array 102 with virtual large-small pixels 110 in accordance with the teachings of the present invention. In one example, the virtual large-small pixels 110 may include pixels that that include at least a virtual large photodiode and a virtual small photodiode, which have symmetrical pixels having the same sized photodiodes that are fabricated with the same semiconductor process conditions, but have different light sensitivity in accordance with the teachings of the present invention. As shown in the depicted example, virtual HDR large-small pixel image sensing system 100 includes pixel array 102 coupled to control circuitry 108, and readout circuitry 104, which is coupled to function logic 106.

In one example, pixel array 102 is a two-dimensional (2D) array of imaging sensors or virtual large-small pixels 110 (e.g., pixels P1, P2 . . . , Pn). In one example, each virtual large-small pixels 110 is a CMOS imaging pixel including at least a virtual large photodiode and a virtual small photodiode. As illustrated, each virtual large-small pixel 110 is arranged into a row (e.g., rows R1 to Ry) and a column (e.g., column C1 to Cx) to acquire image data of a person, place, object, etc., which can then be used to render an image of the person, place, object, etc.

In one example, after each virtual large-small pixel 110 has acquired its image data or image charge, the image data is read out by readout circuitry 104 through readout columns 112 and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
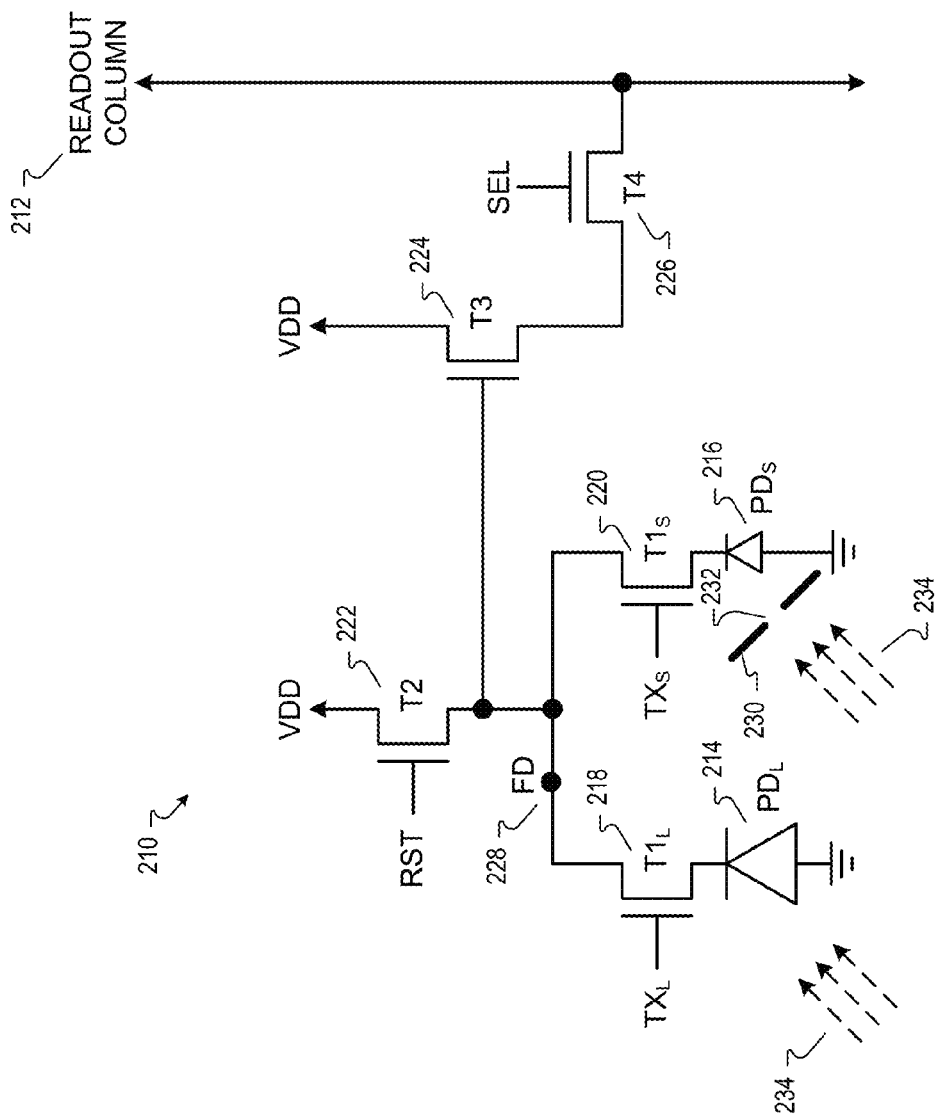
FIG. 2 is a schematic illustrating one example of HDR pixel circuitry of an image sensor including an example virtual high dynamic range large-small pixel in accordance with the teachings of the present invention.

FIG. 2 is a schematic illustrating one example of a virtual large-small pixel 210 in accordance with the teachings of the present invention. In one example, it is appreciated that virtual large-small pixel 110 may be one of the plurality of virtual large-small pixels 110 included in an image sensor with the example pixel array 102 of the virtual HDR large-small pixel image sensing system 100 illustrated above in FIG. 1. It is appreciated that virtual large-small pixel 210 is provided for explanation purposes and therefore represents just one possible architecture for implementing each pixel within pixel array 102 of FIG. 1, and that examples in accordance with the teachings of the present invention are not limited to specific pixel architectures. Indeed, one of ordinary skill in the art having the benefit of the instant disclosure will understand that the present teachings are applicable to 3T, 4T, 5T designs, as well as various other suitable pixel architectures in accordance with the teachings of the present invention.

As shown in the example depicted in FIG. 2, virtual large-small pixel 210 includes a virtual large-small pixel grouping, which includes a virtual large pixel, which includes a transfer transistor $T1_L$ 218 coupled to a virtual large photodiode $PD_L$ 214, and a virtual small pixel, which includes a transfer transistor $T1_S$ 220 coupled to a virtual small photodiode $PD_S$ 216, as shown. In one example, virtual large photodiode $PD_L$ 214 and the virtual small photodiode $PD_S$ 216 have photodiodes that are identically sized and are symmetrically fabricated using identical semiconductor processing conditions.

However, as will be discussed in greater detail below, the virtual small photodiode $PD_S$ 216 also includes a mask 230 having a small opening 232 that is patterned along an optical path for incident light 234 to the virtual small photodiode $PD_S$ 216 in front of the virtual small photodiode $PD_S$ 216, while there is no mask in front of the virtual large photodiode $PD_L$ 214 in accordance with the teachings of the present invention. With the mask 230 disposed only in front of the virtual small photodiode $PD_S$ 216, the size of the small opening 232 in the mask 230 through which incident light 234 is directed to the virtual small photodiode $PD_S$ 216 controls the light sensitivity of the virtual small photodiode $PD_S$ 216 in accordance with the teachings of the present invention. Since mask 230 is disposed only in front of the virtual small photodiode $PD_S$ 216 and not in front of virtual large photodiode $PD_L$ 214, virtual small photodiode $PD_S$ 216 and virtual large photodiode $PD_L$ 214 have different sensitivities to incident light 234. By utilizing both virtual small photodiode $PD_S$ 216 and virtual large photodiode $PD_L$ 214 in virtual large-small pixel 210, HDR imaging sensing is realized in accordance with the teachings of the present invention.

Continuing with example depicted in FIG. 2, charge is photogenerated in virtual small photodiode $PD_S$ 216 and virtual large photodiode $PD_L$ 214 in response to incident light 234 that reaches virtual small photodiode $PD_S$ 216 and virtual large photodiode $PD_L$ 214. The charge that is accumulated in virtual large photodiode $PD_L$ 214 is switched through transfer transistor $T1_L$ 218 to a floating drain FD 228 in response to a control signal $TX_L$, and charge that is accumulated in virtual small photodiode $PD_S$ 216 is switched through transfer transistor $T1_S$ 220 to floating drain FD 228 in response to a control signal $TX_S$.

As shown in the example, virtual large-small pixel 210 also includes an amplifier transistor T3 224 that has a gate terminal coupled to floating drain FD 228. Thus, in the illustrated example, the charges from virtual large photodiode $PD_L$ 214 and virtual small photodiode $PD_S$ 216 are separately switched to floating drain FD 228, which is coupled to amplifier transistor T3 224. In one example, amplifier transistor T3 224 is coupled in a source follower configuration as shown, which therefore amplifies an input signal at the gate terminal of amplifier transistor T3 224 to an output signal at the source terminal of amplifier transistor T3 224. As shown, row select transistor T4 226 is coupled to the source terminal of amplifier transistor T3 224 to selectively switch the output of amplifier transistor T3 224 to readout column 212 in response to a control signal SEL. As shown in the example, virtual large-small pixel 210 also includes reset transistor 222 coupled to floating drain FD 228, virtual large photodiode PD$_L$ 214, and virtual small photodiode PD$_S$ 216, which may be used to reset charge accumulated in pixel 210 in response to a reset signal RST. In one example, the charge accumulated in floating drain FD 228, virtual large photodiode PD$_L$ 214, and virtual small photodiode PD$_S$ 216 can be reset during an initialization period of virtual large-small pixel 210, or for example each time after charge information has been read out from virtual large-small pixel 210 prior to accumulating charge in virtual large photodiode PD$_L$ 214 and virtual small photodiode PD$_S$ 216 for the acquisition of a new HDR image in accordance with the teachings of the present invention.

Figure 3:
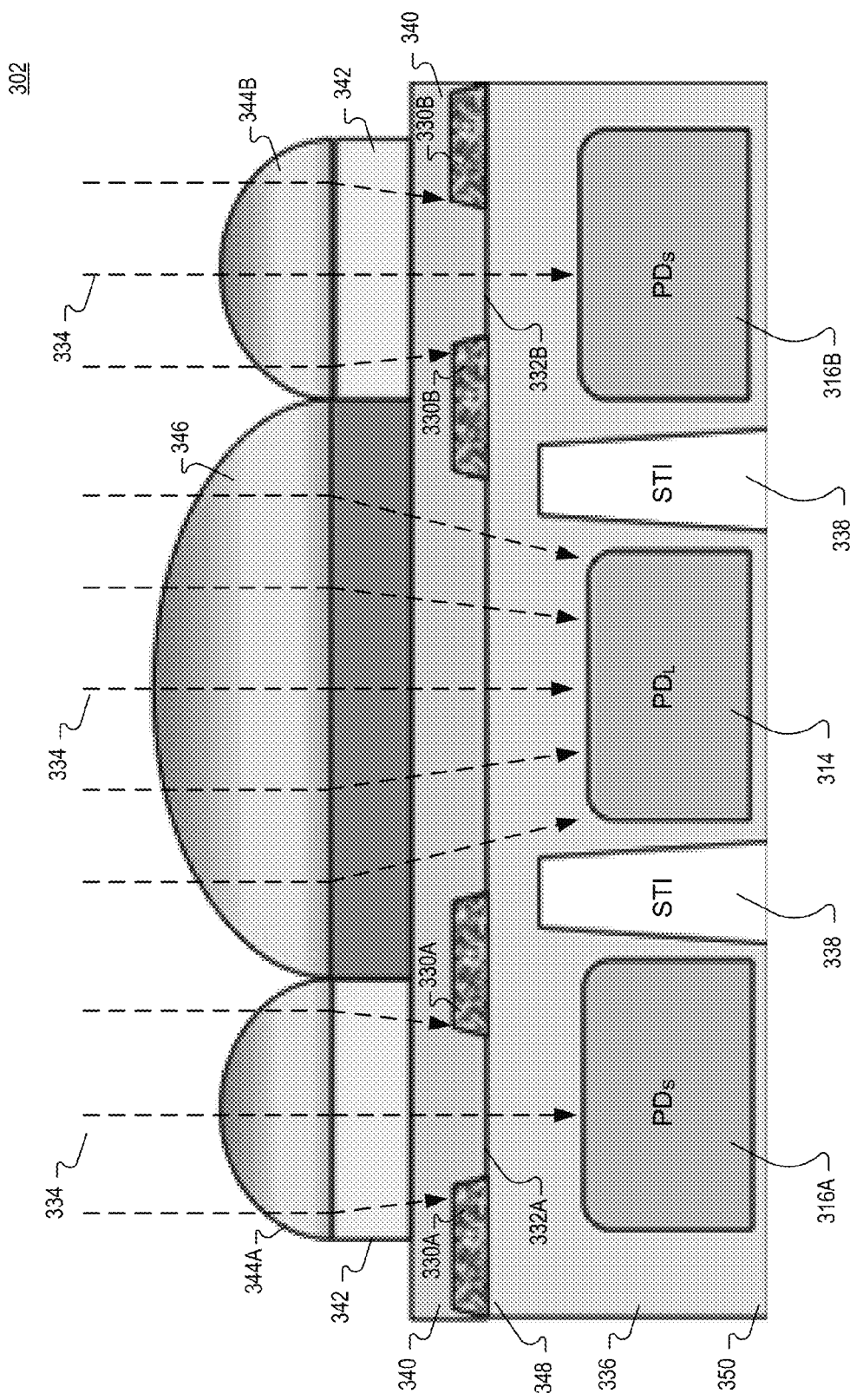
FIG. 3 illustrates a cross-section view of a portion of an example virtual high dynamic range large-small pixel image sensor in accordance with the teachings of the present invention.

FIG. 3 illustrates a cross-section view of a portion of an example pixel array 302 included in an image sensor of an example virtual HDR large-small pixel image sensing system in accordance with the teachings of the present invention. It is appreciated that the portion of example pixel array 302 illustrated in FIG. 3 may be one example of a portion of an implementation of pixel array 102 of virtual HDR large-small pixel image sensing system 100 shown in FIG. 1, including for example the virtual large photodiode PD$_L$ 214 and virtual small photodiode PD$_S$ 216 shown in FIG. 2, and that similarly named and numbered elements referenced below are coupled and function similar to as described above.

As shown in the depicted cross-section, pixel array 302 includes a plurality of photodiodes disposed in semiconductor material 336. In one example, the semiconductor material may include silicon, or another suitable semiconductor material. In the depicted example, the plurality of photodiodes include virtual small photodiode PD$_S$ 316A, virtual large photodiode PD$_L$ 314, and virtual small photodiode PD$_S$ 316B disposed in semiconductor material 336. In one example, the virtual small photodiode PD$_S$ 316A, virtual large photodiode PD$_L$ 314, and virtual small photodiode PD$_S$ 316B are disposed proximate to a front side 350 of semiconductor material 336. In the example, each of the virtual small photodiode PD$_S$ 316A, virtual large photodiode PD$_L$ 314, and virtual small photodiode PD$_S$ 316B share the same fabrication process conditions, same size, same full well capacity, and symmetry in design. In one example, each of the plurality of photodiodes is separated in the semiconductor material 336 by shallow trench isolation (STI) structures 338.

As shown in the depicted example, each of the plurality of photodiodes is illuminated with incident light 334 that is directed through a back side 348 of semiconductor material 336 as shown. In the depicted example, an oxide layer 340 is disposed over the back side 348 of semiconductor material 336, with a color filter array 342 is disposed over the oxide layer 340, and an array of microlenses disposed over the color filter array 342. In one example, color filter array includes a mosaic of color filters, each of which is disposed over a respective photodiode of the pixel array 302 as shown to capture color information. Similarly, the array of microlenses includes a plurality of microlenses, each of which is disposed over a respective photodiode of the pixel array 302 as shown to direct incident light 334 to a respective photodiode of the pixel array 302.

Thus, as shown in the depicted example, incident light 334 is directed through a microlens 344A of the array of microlenses, through a respective color filter of color filter array 342, through oxide layer 340, through back side 348 of semiconductor material 336 to virtual small photodiode PD$_S$ 316A. Similarly, incident light 334 is directed through a microlens 346 of the array of microlenses, through a respective color filter of color filter array 342, through oxide layer 340, through back side 348 of semiconductor material 336 to virtual large photodiode PD$_L$ 314. Similarly, incident light 334 is directed through a microlens 344B of the array of microlenses, through a respective color filter of color filter array 342, through oxide layer 340, through back side 348 of semiconductor material 336 to virtual small photodiode PD$_S$ 316B.

In one example, pixel array 302 also includes a mask that is patterned over the back side 348 of semiconductor material 336 along an optical path of incident light 334 to each respective photodiode in the semiconductor material 336. In the example, the mask disposed on the semiconductor material 336 between the plurality of microlenses and the plurality of photodiodes in the semiconductor material 336. In the example, the mask is covered with oxide layer 340 as shown, and is patterned such that the mask is disposed only over the virtual small photodiodes, and is not disposed over any of the virtual large photodiodes. In the example, the mask is further patterned such that the mask that is disposed over a virtual small photodiode defines an opening through which only a portion of the incident light is allowed to reach the underlying virtual small photodiode, while a portion of the incident light is masked (e.g., blocked, obstructed, prevented, etc.) by the mask from reaching the underlying virtual small photodiode in accordance with the teachings of the present invention.

To illustrate, the example depicted in FIG. 3 illustrates mask 330A disposed over back side 348 of semiconductor material 336 over virtual small photodiode PD$_S$ 316A, and mask 330B disposed over back side 348 of semiconductor material 336 over virtual small photodiode PD$_S$ 316B. As shown in the example, there is no mask disposed over virtual large photodiode PD$_L$ 314. In the example, mask 330A includes an opening 332A through which a portion of incident light 334 directed through microlens 344A is allowed to reach underlying virtual small photodiode PD$_S$ 316A. However, a portion of incident light 334 directed through microlens 344A is blocked by mask 330A from reaching the underlying virtual small photodiode PD$_S$ 316A as shown. Similarly, mask 330B includes an opening 332B through which a portion of incident light 334 directed through microlens 344B is allowed to reach virtual small photodiode PD$_S$ 316B. However, a portion of incident light 334 directed through microlens 344B is blocked by mask 330B from reaching the underlying virtual small photodiode PD$_S$ 316B as shown. Since there is no mask over virtual large photodiode PD$_L$ 314, there is no portion of incident light 334 directed through microlens 346 that is blocked by a mask from reaching the underlying virtual large photodiode PD$_L$ 314 as shown.

Therefore, with a portion of the incident light 334 blocked by masks 330A and 330B from reaching the virtual small photodiode PD$_S$ 316A and PD$_S$ 316B, and with no incident light 334 blocked from reaching the virtual large photodiode PD$_L$ 314, it is appreciated that the virtual small photodiode PD$_S$ 316A and PD$_S$ 316B have lower light sensitivity, while the virtual large photodiode PD$_L$ 314 has high light sensitivity in accordance with the teachings of the present invention. In one example, the mask (e.g., mask 330A, mask 330B) over back side 348 of semiconductor material 336 may by a metal mask, including for example aluminum, tungsten, or another suitable masking material.

In the example, the sizes of the openings (e.g., opening 332A, opening 332B) may be selected based on the desired sensitivity ratios as well as other design requirements of pixel array 302 in accordance with the teachings of the present invention. For instance, in one example, each photodiode, including virtual small photodiode $PD_S$ 316A and $PD_S$ 316B, and with virtual large photodiode $PD_L$ 314, may be sized at around 2×2 to 4×4 μm, and each mask opening, including opening 332A and 332B, may be controlled at 0.7×0.7 μm to 1.5×1.5 μm. It is appreciated that the mask opening sizes are sufficiently large to reduce or minimize diffracting effects for visible light wavelengths.

Figure 4B:
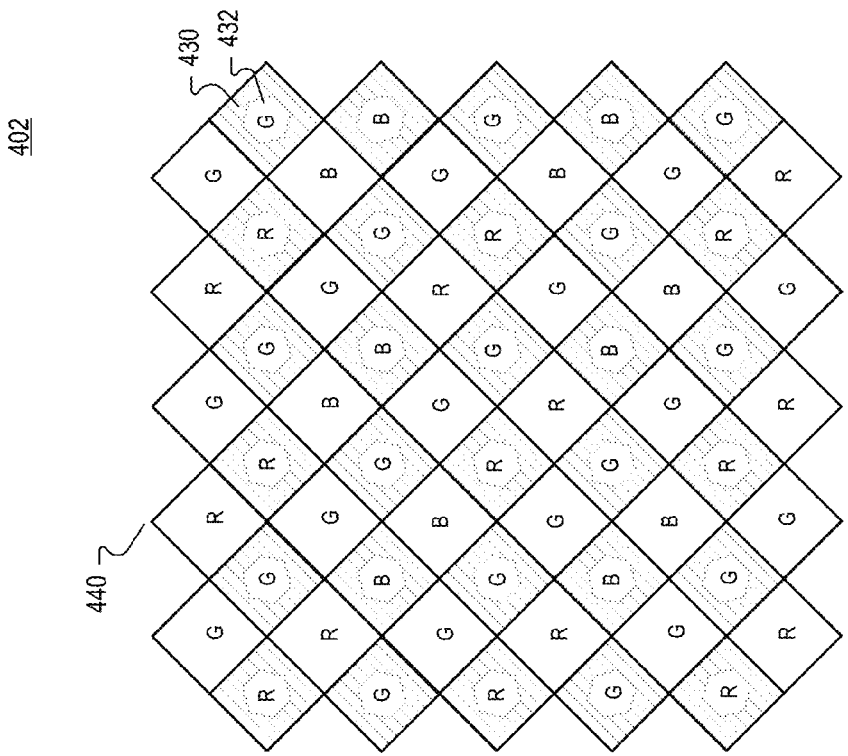
FIG. 4B illustrates a top down view of an example color filter array arranged over a portion showing an example virtual high dynamic range large-small pixel image sensor in accordance with the teachings of the present invention.
Figure 4A:
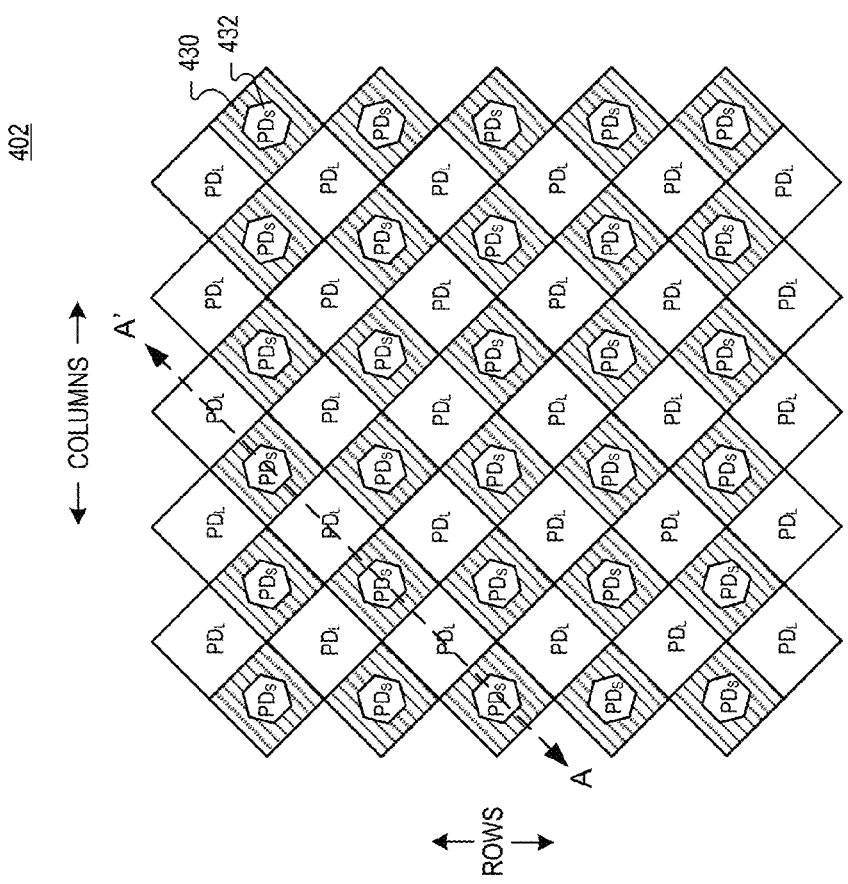
FIG. 4A illustrates a top down view of a portion of an example virtual high dynamic range large-small pixel image sensor in accordance with the teachings of the present invention.

FIG. 4A illustrates a top down view of a portion of a pixel array 402 included in an example virtual high dynamic range large-small pixel image sensor in accordance with the teachings of the present invention. It is noted that the portion of example pixel array 402 illustrated in FIG. 4 may be a top down view of a one example of a portion of an implementation of pixel array 102 of virtual HDR large-small pixel image sensing system 100 shown in FIG. 1, including for example the virtual large photodiode $PD_L$ 214 and virtual small photodiode $PD_S$ 216 shown in FIG. 2, or a top down view of the example portion of the pixel array 302 of FIG. 3, and that similarly named and numbered elements referenced below are coupled and function similar to as described above. For instance, it is appreciated that the cross-section example pixel array 302 illustrated in FIG. 3 may be a cross-section along dashed line A-A' of pixel array 402 of FIG. 4A.

As shown in the example depicted in FIG. 4A, pixel array 402 includes a plurality of virtual large-small pixel groupings, with each grouping including for example a virtual small photodiode $PD_S$ and virtual large photodiode $PD_L$. Each of virtual small photodiode $PD_S$ and virtual large photodiode $PD_L$ is identically sized and symmetrically fabricated using the same semiconductor processing conditions. However, there is a mask 430 disposed over each virtual small photodiode $PD_S$, and there is no mask 430 disposed over any of the virtual large photodiodes $PD_L$. Accordingly, it is appreciated that in the depicted example, the ratio of the total number of masks 430 to the combined total number of virtual large and small photodiodes (e.g., $PD_L+PD_S$) in pixel array 402 is 1:2.

In addition, as illustrated in the depicted example, each one of the plurality of masks 430 includes an opening 432 that allows only a portion of incident light to reach the respective underlying virtual small photodiode $PD_S$. As such, less incident light reaches each virtual small photodiode $PD_S$ compared to the amount of incident light that reaches each virtual large photodiode $PD_L$. Accordingly, each light virtual small photodiode $PD_S$ has low light sensitivity, while each virtual large photodiodes $PD_L$ has high light sensitivity in accordance with the teachings of the present invention. The sizes of the openings 432 in each mask 430 through which the incident light is directed to the virtual small photodiode $PD_S$ controls the light sensitivity of the virtual small photodiode $PD_S$ in accordance with the teachings of the present invention.

Furthermore, as illustrated in the depicted example, each virtual large photodiode $PD_L$ and its corresponding virtual small photodiode $PD_S$ in a virtual large-small pixel grouping is arranged in the semiconductor material in adjacent columns and rows of pixel array 402 as shown. In other words, each respective virtual large photodiode $PD_L$ and its corresponding virtual small photodiode $PD_S$ of the virtual large-small pixel grouping are adjacent to each other and arranged along a diagonal in pixel array 402 as shown in the example of FIG. 4A.

FIG. 4B illustrates a top down view of the portion of the pixel array 402 showing the example color filter array 440 arranged over the portion of an example virtual high dynamic range large-small pixel image sensor as illustrated in FIG. 4A. As shown in the example, color filter array 440 includes a mosaic of color filters, each of which is disposed over a respective photodiode of the pixel array 402 as shown to capture color information. In the example, the color filter array 440 includes red (R), blue (B), and green (G) color filters. It is noted that the example depicted in FIG. 4B depicts a color filter array 440 in which the filter itself is depicted as being rotated 45 degrees. However, it is noted that each pair (e.g., grouping) of virtual large photodiode $PD_L$ and virtual small photodiode $PD_S$ in pixel array 402 has the same color filter over them.

Accordingly, as shown in the example depicted in FIG. 4B, for each virtual large photodiode $PD_L$ in pixel array 402 that has a red (R) color filter, the corresponding adjacent virtual small photodiode $PD_S$ of that pair also has a red (R) color filter. For each virtual large photodiode $PD_L$ in pixel array 402 that has a green (G) color filter, the corresponding adjacent virtual small photodiode $PD_S$ of that pair also has a green (G) color filter. Similarly, for each virtual large photodiode $PD_L$ in pixel array 402 that has a blue (B) color filter, the corresponding adjacent virtual small photodiode $PD_S$ of that pair also has a blue (B) color filter.

Thus, unlike a conventional Bayer color filter design, the example color filter array 440 illustrated in FIG. 4B shows that there are always two adjacent photodiodes detecting the same color. One reason for this type of color array is to contribute to pixel "binning," where two adjacent photodiodes can be merged, making the sensor itself more "sensitive" to light. Another reason is for the sensor to record two different exposures, which is then merged to produce an image with greater dynamic range. In one example, the underlying circuitry has two read-out channels that take their information from alternate rows of the sensor. The result is that it can act like two interleaved sensors, with different exposure times for each half of the photosites. Half of the photosites can be intentionally underexposed so that they fully capture the brighter areas of the scene. This retained highlight information can then be blended in with the output from the other half of the sensor that is recording a "full" exposure, again making use of the close spacing of similarly colored photodiodes in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:
1. An image sensor, comprising:
   a plurality of photodiodes arranged in semiconductor material, wherein the plurality of photodiodes is disposed proximate to a front side of the semiconductor material, wherein each one of the plurality of photodiodes is identically sized and is fabricated in the semiconductor material with identical semiconductor processing conditions, wherein the plurality of photodiodes are organized into virtual large-small groupings including a first photodiode and a second photodiode;

an array of microlenses disposed over the semiconductor material, wherein each one of the microlenses is disposed over a respective one of the photodiodes, wherein a first microlens of the array of microlenses is disposed over the first photodiode, and wherein a second microlens of the array of microlenses is disposed over the second photodiode, and wherein a full well capacity of the first photodiode is substantially equal to a full well capacity of the second photodiode, wherein the second microlens is larger than the first microlens to direct more of the incident light into the second photodiode than the first photodiode; and a mask disposed over the semiconductor material along an optical path between the first microlens and the first photodiode, wherein the mask includes an opening through which a first portion of incident light directed through the first microlens is directed to the first photodiode, wherein a second portion of the incident light directed through the first microlens is blocked by the mask from reaching the first photodiode, wherein there is no mask disposed over the semiconductor material along an optical path between the second microlens and the second photodiode, and wherein a quantity of the incident light that reaches the second photodiode is greater than the first portion of the incident light that reaches the first photodiode, wherein the mask is disposed proximate to a back side of the semiconductor material, and wherein the incident light is directed through the back side of the semiconductor material to the plurality of photodiodes.

2. The image sensor of claim 1 further comprising a color filter array disposed over the semiconductor material between the array of microlenses and the plurality of photodiodes in the semiconductor material.

3. The image sensor of claim 1 wherein the mask is comprised of a metal.

4. The image sensor of claim 3 further comprising an oxide layer disposed over the semiconductor material, wherein the mask is disposed in the oxide layer over the semiconductor material.

5. The image sensor of claim 1 wherein the first photodiode is a low light sensitivity photodiode of a high dynamic range pixel of image sensor, and wherein the second photodiode is a high light sensitivity photodiode of the high dynamic range pixel of image sensor.

6. The image sensor of claim 1 wherein the first photodiode and the second photodiode of each virtual large-small grouping are arranged in the semiconductor material in adjacent columns and rows of a pixel array.

7. The image sensor of claim 6 wherein the first photodiode and the second photodiode of each virtual large-small grouping are adjacent in the semiconductor material of a pixel array.

8. The image sensor of claim 7 further comprising a color filter array disposed over the semiconductor material between the array of microlenses and the plurality of photodiodes in the semiconductor material, wherein the color filter array includes a plurality of color filters, wherein each one of the color filters is one of a first color, a second color, or a third color.

9. The image sensor of claim 8 wherein a first one of the plurality of color filters is disposed over the first photodiode, and a second one of the plurality of color filters is disposed over the second photodiode, wherein the first and second color filters are both the first color.

10. The image sensor of claim 1 wherein a ratio of a total number of masks to a combined total number of photodiodes in the pixel array is 1:2.

11. An imaging system, comprising:

a pixel array including a plurality of photodiodes arranged in semiconductor material, wherein the plurality of photodiodes is disposed proximate to a front side of the semiconductor material, wherein each one of the plurality of photodiodes is identically sized and is fabricated in the semiconductor material with identical semiconductor processing conditions, wherein the plurality of photodiodes are organized into virtual large-small groupings including a first photodiode and a second photodiode, wherein the first photodiode and the second photodiode of each virtual large-small grouping are arranged in the semiconductor material in adjacent columns and rows of a pixel array and are adjacent in the semiconductor material;

an array of microlenses disposed over the semiconductor material, wherein each one of the microlenses is disposed over a respective one of the photodiodes, wherein a first microlens of the array of microlenses is disposed over the first photodiode, and wherein a second microlens of the array of microlenses is disposed over the second photodiode;

a mask disposed over the semiconductor material along an optical path between the first microlens and the first photodiode, wherein the mask includes an opening through which a first portion of incident light directed through the first microlens is directed to the first photodiode, wherein a second portion of the incident light directed through the first microlens is blocked from reaching the first photodiode, wherein there is no mask disposed over the semiconductor material along an optical path between the second microlens and the second photodiode, and wherein a quantity of the incident light that reaches the second photodiode is greater than the first portion of the incident light that reaches the first photodiode, wherein the mask is disposed proximate to a back side of the semiconductor material, and wherein the incident light is directed through the back side of the semiconductor material to the plurality of photodiodes;

a color filter array disposed over the semiconductor material between the array of microlenses and the plurality of photodiodes in the semiconductor material, wherein the color filter array includes a plurality of color filters, wherein each one of the color filters is one of a first color, a second color, or a third color, wherein a first one of the plurality of color filters is disposed over the first photodiode, and a second one of the plurality of color filters is disposed over the second photodiode, wherein the first and second color filters are both a same color, and wherein the second microlens is larger than the first microlens to direct more of the incident light into the second photodiode than the first photodiode, and wherein first lateral bounds of the first one of the plurality of color filters are smaller than second lateral bounds of the second one of the plurality of color filters, and wherein the second lateral bounds of the second one of the plurality of color filters are substantially the same as third lateral bounds of the second microlens;

control circuitry coupled to the pixel array to control operation of the pixel array; and readout circuitry coupled to the pixel array to readout image data from the pixel array.

12. The imaging system of claim 11 further comprising function logic coupled to the readout circuitry to store the image data readout from the pixel array.

13. The imaging system of claim 11 further comprising a color filter array disposed over the semiconductor material between the array of microlenses and the plurality of photodiodes in the semiconductor material.

14. The imaging system of claim 11 further comprising an oxide layer disposed over the semiconductor material, wherein the mask is disposed in the oxide layer over the semiconductor material.

15. The imaging system of claim 11 wherein the first photodiode is a low light sensitivity photodiode of a high dynamic range pixel of image sensor, and wherein the second photodiode is a high light sensitivity photodiode of the high dynamic range pixel of image sensor.

16. The imaging system of claim 15 wherein a full well capacity of the first photodiode is substantially equal to a full well capacity of the second photodiode.

17. The imaging system of claim 11 wherein a ratio of a total number of masks to a combined total number of photodiodes in the pixel array is 1:2.

* * * * *